US010056921B2

(12) United States Patent
Lu et al.

(10) Patent No.: US 10,056,921 B2
(45) Date of Patent: Aug. 21, 2018

(54) MEMORY SYSTEM HAVING FLEXIBLE ECC SCHEME AND METHOD OF THE SAME

(71) Applicant: TAIWAN SEMICONDUCTOR MANUFACTURING COMPANY LTD., Hsinchu (TW)

(72) Inventors: Shih-Lien Linus Lu, Hsinchu (TW); Yu-Der Chih, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/247,130

(22) Filed: Aug. 25, 2016

(65) Prior Publication Data
US 2018/0062670 A1    Mar. 1, 2018

(51) Int. Cl.
| | |
|---|---|
| *H03M 13/35* | (2006.01) |
| *G06F 3/06* | (2006.01) |
| *G06F 11/10* | (2006.01) |
| *G11C 29/52* | (2006.01) |
| *H03M 13/05* | (2006.01) |
| *H03M 13/29* | (2006.01) |
| *H03M 13/00* | (2006.01) |

(52) U.S. Cl.
CPC .......... *H03M 13/356* (2013.01); *G06F 3/064* (2013.01); *G06F 3/0619* (2013.01); *G06F 3/0679* (2013.01); *G06F 11/1068* (2013.01); *G11C 29/52* (2013.01); *H03M 13/05* (2013.01); *H03M 13/29* (2013.01); *H03M 13/6508* (2013.01)

(58) Field of Classification Search
USPC ................... 714/755, 763, 764, 718
See application file for complete search history.

(56) References Cited

U.S. PATENT DOCUMENTS

| 6,018,817 | A  * | 1/2000  | Chen ............... G06F 11/1012 714/718 |
| 6,279,072 | B1 * | 8/2001  | Williams ........... G06F 11/1052 711/105 |
| 8,656,255 | B1 * | 2/2014  | Nemazie ........... G06F 11/1008 365/133 |
| 8,930,647 | B1 * | 1/2015  | Smith ................ G06F 9/44557 711/103 |
| 9,176,671 | B1 * | 11/2015 | Smith .................... G06F 3/061 |

(Continued)

*Primary Examiner* — Fritz Alphonse
(74) *Attorney, Agent, or Firm* — WPAT, P.C., Intellectual Property Attorneys; Anthony King

(57) ABSTRACT

A memory system is disclosed. The memory system includes: a memory; a first ECC circuit used to encode information bits of a first length into a codeword of a first ECC scheme, and to decode a codeword of the first ECC scheme read from the memory into decoded information bits of the first length; a second ECC circuit used to encode information bits of a second length into a codeword of a second ECC scheme, and to decode a codeword of the second ECC scheme read from the memory into decoded information bits of the second length; and a control circuit used to combine a plurality sets of the decoded information bits of the first length into the information bits of the second length, and to separate the decoded information bits of the second length into a plurality sets of the information bits of the first length.

19 Claims, 3 Drawing Sheets

(56) References Cited

U.S. PATENT DOCUMENTS

2014/0181614 A1* 6/2014 Kwok ............... H03M 13/1515
714/755
2015/0143037 A1* 5/2015 Smith .................... G06F 3/061
711/103

* cited by examiner

MEMORY SYSTEM HAVING FLEXIBLE ECC SCHEME AND METHOD OF THE SAME

BACKGROUND

Memory is widely used to store information (both data and program) in a digital system. During the operation of the system, information (bits) stored in the memory may be corrupted due to various reasons. One possible cause of the corruption is due to environmental events both internal to the memory and outside of the memory. One such outside event is a particle strike. There are other reasons which cause the corruption (failure) of bits besides environmental events. When a bit is corrupted, information stored is lost resulting system failure or data lost. Therefore it is important to protect the integrity of the memory content.

Various means for protecting the memory content from corruption have been used. Error correction codes (ECC) have the advantage of being able to detect errors in a data field, and also to correct errors. However, medium, such as memory, used in a system may need to go through different phases where the operation condition may be different, for example the ambient temperature. In particular, data retention may become weaker at higher temperature in this example. As such, there is a need to protect the data content with a stronger ECC scheme in some phases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
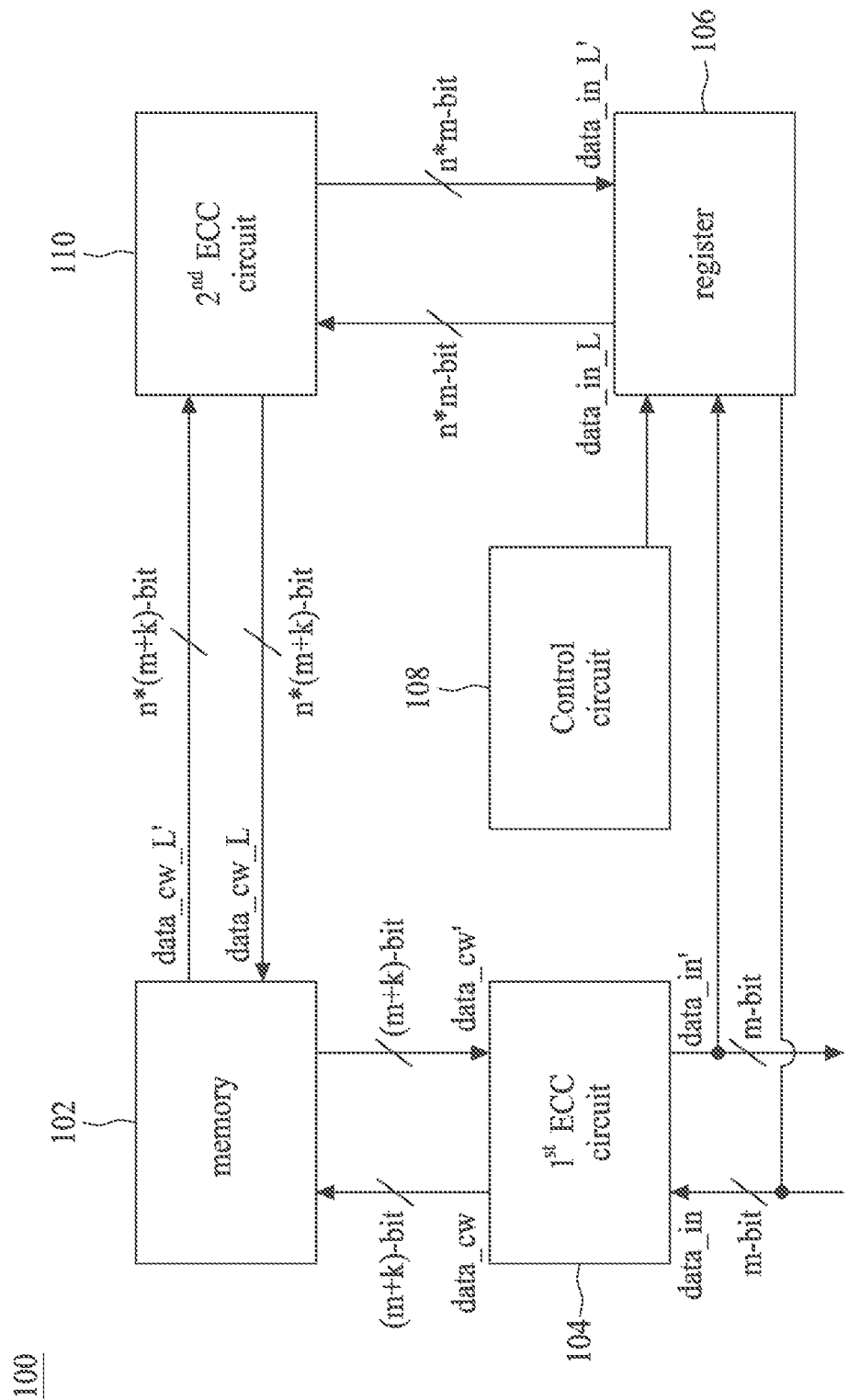
FIG. 1 is a diagram illustrating a memory system 100 having a flexible ECC scheme in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

There are many types of semiconductor memories both in circuit construction and memory storage materials used, such as dynamic random-access memory (DRAM), static random-access memory (SRAM), magnetic tunnel junction random-access memory (MRAM), and resistive random-access memory (ReRAM) etc. Memory is usually arranged in a 2-dimensional array. A memory array may be a device of itself or embedded in another device, can include many memory cells. Each memory cell can typically store one bit of information by holding or not holding a charge in, for example, a capacitor. The presence or absence of a charge indicates, for example, logic 1 when a charge is stored, and logic 0 when no charge is stored. Electrical disturbance, such as interference from noise or radiation, can change the contents of one or more memory cells or interfere with the circuitry used to read and write data to the memory cells. Furthermore, memory devices are being designed to operate at increasingly higher throughput rates and lower power consumption, which can lead to increasingly higher bit error rates. A bit error can cause corruption of data, security vulnerabilities, or a system crash.

Error correcting code (ECC) can be used to detect and correct bit errors stored in a memory. ECC encodes data by generating ECC check bits, e.g., redundancy bits or parity bits, that are stored along with the data in a memory device. Data and check bits together formed the code word. For example, an ECC that generates 8 parity bits for 64 bits of data can usually detect two bit errors and correct one bit error in the entire codeword of 72 bits. This is known as a SECDED code, which is capable of single-error correcting (SEC) and double-error detecting (DED).

There needs to be some additional memory space to store the check bits besides the devices used to store data. For memory array in a stone along device (chip), typically, an additional or more memory device(s) (chip(s)) is (are) used in a system to keep check bits thus providing the ECC capability. For memory array embedded in another IC chip, additional columns, usually, are added to store the check bits. Thus a codeword (say, n-bits) is made out of data bits (say, m-bits) and check bits (say, k-bits) (n=m+k). For example, an ECC memory that can provide 8-bit parity for each 32-bit data word may include a 40-bit wide interface to access a 40-bit codeword with 32-bit data. Similarly, an ECC memory that can provide 8-bit parity for each 64-bit data word may include a 72-bit wide interface to access a 72-bit codeword with 64-bit data.

The present disclosure discloses a flexible ECC scheme to protect a memory block with multiple error rate requirements. The flexible ECC scheme may be used to protect contents of the memory block with a stronger ECC during special retention phases such as at high temperature. For example, a SECDED code is used for 64 bits of data and it needs 8 parity bits. However, when multiple words are combined, say combining 16 words to form a longer codeword (16*72 bits=1152 bits), the combined codeword with 1024 bits of data has 128 parity bits. The longer codeword is capable of correcting 11 bit errors and detecting more than 12 bit errors, which is stronger than the 72-bit codeword.

FIG. 1 is a diagram illustrating a memory system 100 having a flexible ECC scheme in accordance with an exemplary embodiment of the present disclosure. The memory system 100 includes a memory 102, a first ECC circuit 104, a register 106, a control circuit 108 and a second ECC circuit 110. As described herein, the memory 102 may include any device that stores information. For example, the memory 101 may include a flash memory, magnetic disk, a bubble memory, a first-in-first out (FIFO) memory, a dual-port memory, a random access memory (RAM), a dynamic memory, a static memory, a compact disk (CD), a DVD, a holographic optical disk, and the like.

As described herein, the first ECC circuit 104 and the second ECC circuit 110 may include any technique or algorithm that adds redundancy to information to reduce or prevent errors. For example, error correcting codes can include non-binary block codes such as the Reed-Solomon [255, 239] or [255, 221] codes, linear block codes such as Hamming codes, cyclic Hamming codes, Hadamard codes such as the Hadamard [16, 5] code, Golay codes such as the Golay [23, 12] code, the extended Golay [24, 12] code, or the cyclic Golay [24, 12] code, Bose-Chaudhuri-Bocquenghem (BCH) codes, maximum length shift-register codes, a Reed-Muller code, an alternant code, a Goppa code, binary and non-binary convolutional codes, dual-K codes, turbo codes, turbo product codes, LDPC codes, concatenated codes made from enclosing one code inside another, and the like. The strength of the error correcting code can be adjusted as needed by adding more parity bits. For example, the strength of a code can be measured by a minimum Hamming distance.

In the exemplary embodiment, the memory system 100 has at least two phases. The first phase is an operational phase normally works at a normal temperature range well below typical elevated bonding or reflow temperatures. By way of example, the normal temperature range within the teachings of the present disclosure may be from about 15° C. to about 125° C. as opposed to a typical bonding or reflow temperature range of about 300° C. to about 400° C. known in the industry. However, this is not a limitation of the present disclosure. The second phase is a storage phase normally works at the bonding or reflow temperature range as mentioned above. During the operational phase, the first ECC circuit 104 generating a shorter codeword may be used to protect data from noise and possible bit failure at normal operation. During the storage phase, the second ECC circuit 106 generating a longer codeword may be used to help contents of the memory to survive from a harsh environment.

The first ECC circuit 104 may include a first ECC encoder and a first ECC decoder. During a memory write operation of the operational phase, the codeword data_cw is fed into the memory 102 after being generated by the first ECC encoder of the first ECC circuit 104. The first ECC encoder of the first ECC circuit 104 is used to convert a data sequence corresponding to input information bits data_in on a transmission side among received data into an encoded codeword. In the exemplary embodiment, input information bits data_in may be an m-tuple vector comprised of m bits. Encoded codeword data_cw may be an (m+k)-tuple vector comprised of (m+k) bits. The encoded codeword data_cw may be composed of the input information bits data_in and parity bits. The parity bits may be a k-tuple vector comprised of k bits. In some embodiments, the first ECC encoder of the first ECC circuit 104 may perform matrix multiplication on the input information bits data_in and a predefined generator matrix determined according to the type of the employed ECC.

During a memory read operation of the operational phase, the first ECC decoder of the first ECC circuit 104 is used to compute a syndrome of the codeword data_cw' read from the memory 102 and generate decoded information bits data_in' accordingly. In particular, the ECC decoder may perform matrix multiplication on a predefined parity-check matrix and the codeword data_cw'. The predefined parity-check matrix may be determined according to the type of the employed ECC.

Figure 2:
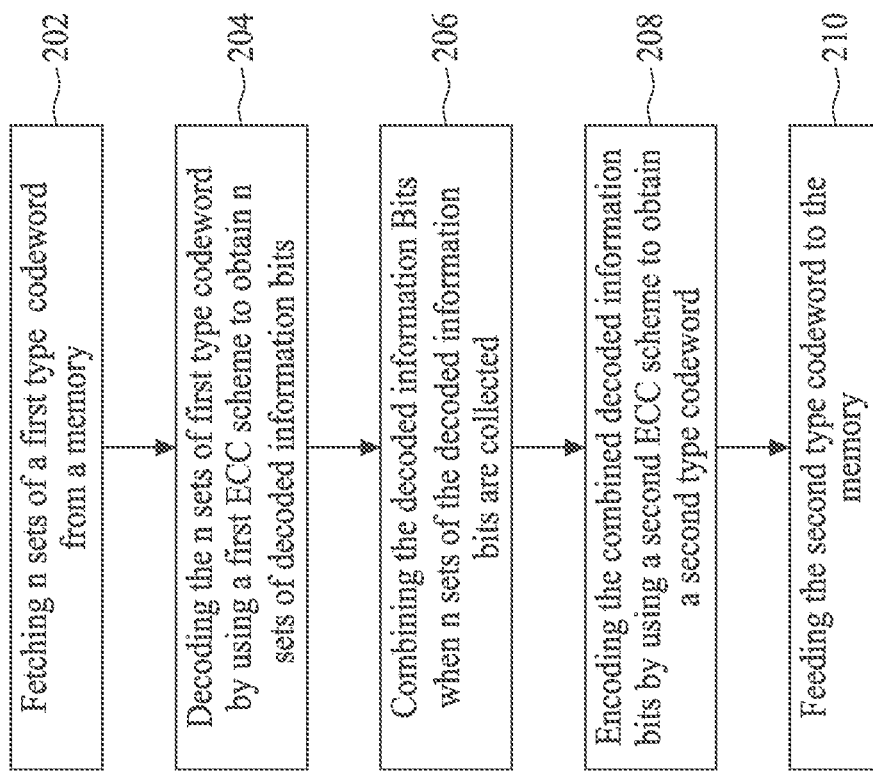
FIG. 2 is a flow chart illustrating a method of a flexible ECC scheme during a transition from the operational phase to the storage phase in accordance with an exemplary embodiment of the present disclosure.

FIG. 2 is a flow chart illustrating a method of a flexible ECC scheme during a transition from the operational phase to the storage phase in accordance with an exemplary embodiment of the present disclosure. In operation 202, also referring to FIG. 1, the memory 102 is in the operational phase and contents of the memory 102 may be sequentially read out. For example, n sets of the (m+k)-bit codeword data_cw' are read out from the memory 102, wherein n is a positive integer. However, this is for ease of understanding only and not a limitation of the present disclosure. In the exemplary embodiments, the operation 202 keeps going on until all the codewords data_cw' are read out from the memory 102, in operation 204, the n sets of codeword data_cw' are decoded by the first ECC circuit 104 codeword by codeword and therefore sequentially generating n sets of decoded information bits data_in'. At the same time, the n sets of decoded information bits data_in' are temporarily collected and stacked in the register 106 as indicated in operation 206 under the control of the control circuit 108. When the n sets of information bits data_in' have been fully collected in the register 106, the n sets of information bits data data_in' are combined to become an (n*m)-bit information bits data_in_L and transmit the information bits data_in_L to the second ECC circuit 110.

In operation 208, the (n*m)-bit information bits data_in_L are encoded by the second ECC circuit 110 into an n*(m+k)-bit codeword data_cw_L and are written back to the memory 102 according to operation 210, wherein the n*(m+k)-bit codeword data_cw_L is longer than the codeword data_cw'. In the exemplary embodiment, the operation 202 to the operation 210 may be repeatedly performed until all the (m+k)-bit codewords in the memory 102 are replaced by the n*(m+k)-bit codewords. After that, the memory system 100 enters the storage phase, wherein the n*(m+k)-bit codewords in the memory 102 is stronger than the (m+k)-bit codewords. In effect, each codeword data_cw_L includes n*m data bits and n*k check bits for ECC scheme 2; and each codeword data_cw includes m data bits and k check bits for ECC scheme 1. Since the check bits grow at a different rate then data bits, a stronger protection for n*k check bits is therefore obtained. For example, if m=64 and k=8. With scheme 1 we can achieve SECDED only. However if n=4, then n*m=256 and n*k=32. With a code word of 288 bits (256 data bits and 32 check bits), an ECC code with a capability of 3-bit error correction and 4-bit error detection can be obtained. As such, the n*(m+k)-bit codeword can have a stronger immunity for higher temperature.

Figure 3:
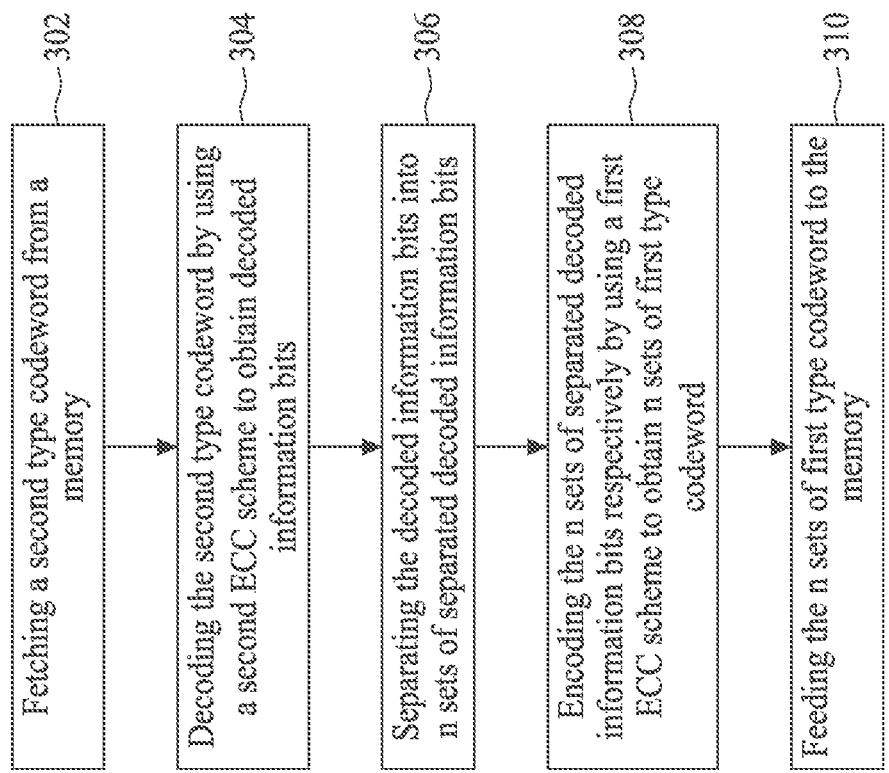
FIG. 3 is a flow chart illustrating a method of a flexible ECC scheme during a transition from the storage phase to the operational phase in accordance with an exemplary embodiment of the present disclosure.

FIG. 3 is a flow chart illustrating a method of a flexible ECC scheme during a transition from the storage phase to the operational phase in accordance with an exemplary embodiment of the present disclosure. In operation 302, also referring to FIG. 1, the memory 102 is in the storage phase and contents of the memory 102 may be sequentially read out. For example, one set of the n*(m+k)-bit codeword data_cw_L' is read out from the memory 102. However, this is for ease of understanding only and not a limitation of the present disclosure. In the exemplary embodiments, the operation 202 keeps going on until all the codewords data_cw_L' are read out from the memory 102. In operation 304, the codeword data_cw_L' is decoded by the second ECC circuit 110 and therefore generating (n*m)-bit decoded information bits data_in_L'. The decoded information bits data_in_L' are temporarily stored in the register 106. The information bits data_in_L' are separated into n sets of m-bit information bits data_in and transmitted to the first ECC circuit 104 respectively as indicated in operation 306 under the control of the control circuit 108.

In operation 308, the n sets of m-bit information bits data_in are encoded by the first ECC circuit 104 into an (m+k)-bit codeword data_cw and are written back to the memory 102 according to operation 310, wherein the (m+k)-bit codeword data_cw is shorter than the codeword data_cw_L'. In the exemplary, the operation 302 to the operation 310 may be repeatedly performed until all the n*(m+k)-bit codewords in the memory 102 are replaced by the (m+k)-bit codewords. After that, the memory system 100 enters the operational phase.

One usage of the proposed flexible ECC scheme in some embodiment is with magnetic random access memory (MRAM) such as spin-transfer torque (STT) MRAM. MRAM cells with low stability may randomly flip. The stability (or instability) is determined by a thermal stability factor (delta) which is related to the ambient temperature, i.e. a higher temperature means less stable. When a chip containing MRAM needs to be assembled with other ICs on a substrate or a printed circuit board (PCB), the content of the MRAM at manufacturing time may be damaged by the raised temperature. With this proposed method, a longer codeword is generated by the second ECC circuit 110 thus strengthen the immunity for high temperature.

In some embodiments, the memory system 100 may be used in an automotive system (either on-chip or off-chip) where the memory 102 may be specified for a particular temperature range, wherein higher error rates may be introduced to the memory 102 when the temperature rises. In some embodiments, the memory system 100 may be used in a regular computing platform, for example, a DRAM of a person computer (PC). When the PC going into a sleep mode, contents of the DRAM may suffer from unexpected higher ambient temperature.

Some embodiments of the present disclosure provide a memory system having a flexible ECC scheme. The memory system includes: a memory; a first ECC circuit, coupled to the memory and used to encode information bits of a first length into a codeword of a first ECC scheme, and to decode a codeword of the first ECC scheme read from the memory into decoded information bits of the first length; a second ECC circuit, coupled to the memory and used to encode information bits of a second length into a codeword of a second ECC scheme, and to decode a codeword of the second ECC scheme read from the memory into decoded information bits of the second length; and a control circuit, used to combine a plurality sets of the decoded information bits of the first length into the information bits of the second length, and to separate the decoded information bits of the second length into a plurality sets of the information bits of the first length; wherein the first ECC scheme is different from the second ECC scheme.

Some embodiments of the present disclosure provide a method of a flexible ECC scheme for a memory. The method includes: fetching a plurality sets of codeword of a first ECC scheme from the memory; decoding the plurality sets of codeword of the first ECC scheme to obtain a plurality sets of decoded information bits of a first length; combining the plurality sets of decoded information bits of the first length into decoded information bits of a second length; and encoding the decoded information bits of the second length into a codeword of a second ECC scheme; wherein the first ECC scheme is different from the second ECC scheme.

Some embodiments of the present disclosure provide a method of a flexible ECC scheme for a memory. The method includes: fetching a codeword of a second ECC scheme from the memory; decoding the codeword of the second ECC scheme to obtain decoded information bits of a second length; separating the decoded information bits of the second length into a plurality sets of decoded information bits of a first length; and encoding the plurality sets of decoded information bits of the first length into a plurality sets of codeword of a first ECC scheme; wherein the first ECC scheme is different from the second ECC scheme.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory system having a flexible error correction code (ECC) scheme, comprising:
   a memory;
   a first ECC circuit, coupled to the memory and used to encode information bits of a first length into a codeword of a first ECC scheme, and to decode a codeword of the first ECC scheme read from the memory into decoded information bits of the first length;
   a second ECC circuit, coupled to the memory and used to encode information bits of a second length into a codeword of a second ECC scheme, and to decode a codeword of the second ECC scheme read from the memory into decoded information bits of the second length; and
   a control circuit, used to combine a plurality sets of the decoded information bits of the first length into the information bits of the second length, and to separate the decoded information bits of the second length into a plurality sets of the information bits of the first length;
   wherein the first ECC scheme is different from the second ECC scheme; and
   when the memory system transits from an operational phase of a first temperature to a storage phase of a second temperature, the first ECC circuit decodes the codeword of the first ECC scheme read from the memory into the decoded information bits of the first length, the control circuit combines the plurality sets of the decoded information bits of the first length into the information bits of the second length, and the second ECC circuit encodes the information bits of the second length into the codeword of the second ECC scheme; and
   wherein the second temperature is higher than the first temperature.

2. The memory system of claim 1, wherein the first length is m-bit long, a length of the codeword of the first ECC scheme is (m+k)-bit long, the second length is (n*m)-bit long, a length of the codeword of the second ECC scheme is n*(m+k)-bit long, and m, n and k are positive integers.

3. The memory system of claim 1, wherein when codewords of the first ECC scheme in the memory are completely replaced by codewords of the second ECC scheme, the memory system enters into the storage phase.

4. The memory system of claim 1, wherein when the memory system transits from a storage phase to an operational phase, the second ECC circuit decodes the codeword of the second ECC scheme read from the memory into the decoded information bits of the second length, the control circuit separates the decoded information bits of the second length into the plurality sets of the information bits of the first length, and the first ECC circuit encodes the plurality sets of the information bits of the first length into a plurality sets of the codeword of the second ECC scheme respectively.

5. The memory system of claim 4, wherein when codewords of the second ECC scheme in the memory are completely replaced by codewords of the first ECC scheme, the memory system enters into the operational phase.

6. A method of a flexible error correction code (ECC) scheme for a memory, comprising:

when the memory transits from an operational phase of a first temperature to a storage phase of a second temperature, fetching a plurality sets of codeword of a first ECC scheme from the memory;
decoding the plurality sets of codeword of the first ECC scheme to obtain a plurality sets of decoded information bits of a first length;
combining the plurality sets of decoded information bits of the first length into decoded information bits of a second length; and
encoding the decoded information bits of the second length into a codeword of a second ECC scheme;
wherein the first ECC scheme is different from the second ECC scheme, and the second temperature is higher than the first temperature.

7. The method of claim 6, further comprising:
feeding the codeword of the second ECC scheme to the memory.

8. The method of claim 6, wherein the first length is different form the second length.

9. The method of claim 8, wherein the first length is m-bit long, a length of the codeword of the first ECC scheme is (m+k)-bit long, the second length is (n*m)-bit long, a length of the codeword of the second ECC scheme is n*(m+k)-bit long, and m, n and k are positive integers.

10. The method of claim 9, wherein the plurality sets of codeword of the first ECC scheme includes n sets of codeword of the first ECC scheme, and the plurality sets of decoded information bits of the first length includes n sets of decoded information bits of the first length.

11. The method of claim 7, wherein the operations are performed repeatedly until codewords of the first ECC scheme in the memory are completely replaced by codewords of the second ECC scheme.

12. The method of claim 6, wherein the memory is a magnetic random access memory (MRAM).

13. A method of a flexible error correction code (ECC) scheme for a memory, comprising:
when the memory transits to a storage phase of a first temperature from an operational phase of a second temperature, fetching a codeword of a second ECC scheme from the memory;
decoding the codeword of the second ECC scheme to obtain decoded information bits of a second length;
separating the decoded information bits of the second length into a plurality sets of decoded information bits of a first length; and
encoding the plurality sets of decoded information bits of the first length into a plurality sets of codeword of a first ECC scheme;
wherein the first ECC scheme is different from the second ECC scheme, and the second temperature is higher than the first temperature.

14. The method of claim 13, further comprising:
feeding the plurality sets of codeword of the first ECC scheme to the memory.

15. The method of claim 13, wherein the first length is different form the second length.

16. The method of claim 15, wherein the first length is m-bit long, a length of the codeword of the first ECC scheme is (m+k)-bit long, the second length is (n*m)-bit long, a length of the codeword of the second ECC scheme is n*(m+k)-bit long, and m, n and k are positive integers.

17. The method of claim 16, wherein the plurality sets of codeword of the first ECC scheme includes n sets of codeword of the first ECC scheme, and the plurality sets of decoded information bits of the first length includes n sets of decoded information bits of the first length.

18. The method of claim 14, wherein the operations are performed repeatedly until codewords of the second ECC scheme in the memory are completely replaced by codewords of the first ECC scheme.

19. The method of claim 13, wherein the memory is a magnetic random access memory (MRAM).

\* \* \* \* \*